(12) United States Patent
Hamada et al.

(10) Patent No.: US 8,833,901 B2
(45) Date of Patent: Sep. 16, 2014

(54) LIQUID EJECTION HEAD AND METHOD OF MANUFACTURING THE SAME

(71) Applicant: Canon Kabushiki Kaisha, Tokyo (JP)

(72) Inventors: Yoshihiro Hamada, Yokohama (JP); Tadayoshi Inamoto, Hachioji (JP); Isao Imamura, Kawasaki (JP); Hiroki Kihara, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 66 days.

(21) Appl. No.: 13/749,346

(22) Filed: Jan. 24, 2013

(65) Prior Publication Data

US 2013/0201249 A1    Aug. 8, 2013

(30) Foreign Application Priority Data

Feb. 6, 2012   (JP) ................................. 2012-022995

(51) Int. Cl.
| | | |
|---|---|---|
| *B41J 2/01* | (2006.01) | |
| *B41J 2/14* | (2006.01) | |
| *H01L 21/02* | (2006.01) | |

(52) U.S. Cl.
CPC ............... *B41J 2/01* (2013.01); *B41J 2/14072* (2013.01); *B41J 2/14024* (2013.01); *H01L 21/02126* (2013.01)
USPC ................... 347/20; 347/40; 347/44

(58) Field of Classification Search
USPC ............................................... 347/20, 40, 44
See application file for complete search history.

(56) References Cited

U.S. PATENT DOCUMENTS

| | | | |
|---|---|---|---|
| 4,688,052 A | 8/1987 | Inamoto et al. | |
| 4,688,053 A | 8/1987 | Noguchi et al. | |
| 4,688,054 A | 8/1987 | Inamoto et al. | |
| 4,716,945 A | 1/1988 | Aoki et al. | |
| 5,086,307 A | 2/1992 | Noguchi et al. | |
| 5,524,784 A | 6/1996 | Shiba et al. | |
| 5,558,975 A | 9/1996 | Noguchi et al. | |
| 5,571,659 A | 11/1996 | Noguchi et al. | |
| 5,578,417 A | 11/1996 | Noguchi et al. | |
| 5,578,418 A | 11/1996 | Noguchi et al. | |
| 5,663,752 A | 9/1997 | Imamura et al. | |
| 5,738,911 A | 4/1998 | Imamura et al. | |
| 5,770,271 A | 6/1998 | Imamura | |
| 5,980,026 A | 11/1999 | Imamura et al. | |
| 6,084,612 A * | 7/2000 | Suzuki et al. | .................. 347/50 |
| 6,291,545 B2 | 9/2001 | Imamura | |

(Continued)

FOREIGN PATENT DOCUMENTS

JP      2005-132102 A    5/2005

*Primary Examiner* — Laura Martin
(74) *Attorney, Agent, or Firm* — Fitzpatrick, Cella, Harper and Scinto

(57) ABSTRACT

A liquid ejection head includes: a chip including a substrate having an energy generating element, an ejection orifice member, and an electrode terminal; an electric wiring board; a support member for supporting the wiring board, the support member having an opening surrounding the chip; a chip periphery sealing member which fills a gap between the chip and the opening; and an electrically connecting portion sealing member disposed in contact with the chip periphery sealing member and which covers an electrically connecting portion between the chip and the electric wiring board. The electrically connecting portion sealing member is a cured product of a material containing filler. The chip periphery sealing member is a cured product of a material containing at least one of specific siloxanes. The chip periphery sealing member and the electrically connecting portion sealing member has a difference in coefficient of linear expansion of 50 ppm/° C. or more.

11 Claims, 3 Drawing Sheets

(56) References Cited

U.S. PATENT DOCUMENTS

| | | |
|---|---|---|
| 6,409,931 B1 | 6/2002 | Shimomura et al. |
| 6,586,495 B1 | 7/2003 | Shimomura et al. |
| 6,713,128 B2 | 3/2004 | Shimomura et al. |
| 6,750,290 B2 | 6/2004 | Imamura et al. |
| 6,846,520 B2 | 1/2005 | Shimomura et al. |
| 6,869,541 B2 | 3/2005 | Shimomura et al. |
| 7,687,552 B2 | 3/2010 | Otaka et al. |
| 7,709,554 B2 | 5/2010 | Otaka et al. |
| 7,722,917 B2 | 5/2010 | Shimomura et al. |
| 7,887,162 B2 | 2/2011 | Otaka et al. |
| 7,947,336 B2 | 5/2011 | Otaka et al. |
| 8,011,778 B2 | 9/2011 | Harada et al. |
| 8,157,347 B2 | 4/2012 | Inamoto et al. |
| 2006/0164466 A1* | 7/2006 | Mizuno et al. ............ 347/58 |
| 2008/0291243 A1* | 11/2008 | Osaki ....................... 347/40 |
| 2010/0295888 A1 | 11/2010 | Noguchi et al. |
| 2012/0098885 A1 | 4/2012 | Harada et al. |

* cited by examiner

180# LIQUID EJECTION HEAD AND METHOD OF MANUFACTURING THE SAME

BACKGROUND OF THE INVENTION

1. Field of the Invention

The present invention relates to a liquid ejection head and a method of manufacturing the same.

2. Description of the Related Art

An example of a liquid ejection head includes an ink jet recording head applied to an ink jet method for recording by ejecting recording liquid (ink) onto a recording medium.

Japanese Patent Application Laid-Open No. 2005-132102 discloses an ink jet recording head. In this recording head, an ejecting element substrate (chip) having an energy generating element for generating energy used for ejecting liquid and a member including an ejection orifice and a flow path of the liquid is electrically connected to a flexible wiring board. A chip periphery sealing member for protecting the side surfaces of the chip against ink, dust, and the like is disposed around the periphery of the chip. An electrically connecting portion sealing member for sealing an electrically connecting portion is disposed in a lead bonding portion which is an electrically connecting portion. Those sealing members are formed by applying materials for the sealing members onto predetermined positions and simultaneously heating the materials to be cured.

SUMMARY OF THE INVENTION

According to an aspect of the present invention, there is provided a liquid ejection head, including: a chip including an ejection orifice member including an ejection orifice for ejecting liquid, a substrate including an energy generating element for generating energy for ejecting liquid from the ejection orifice, and an electrode terminal for receiving electric power; an electric wiring board including lead wiring electrically connected to the electrode terminal; a support member for supporting the electric wiring board, the support member having an opening which surrounds the chip; a chip periphery sealing member which fills a gap between the chip and the support member in the opening; and an electrically connecting portion sealing member which is disposed in contact with the chip periphery sealing member and which covers an electrically connecting portion between the chip and the electric wiring board. The electrically connecting portion sealing member is a cured product of a material for forming the electrically connecting portion sealing member containing filler. The chip periphery sealing member is a cured product of a material for forming the chip periphery sealing member containing at least one kind of a polyether-modified polydimethylsiloxane, a polyester-modified polydimethylsiloxane, and an aralkyl-modified polymethylalkylsiloxane. The chip periphery sealing member and the electrically connecting portion sealing member have a difference in coefficient of linear expansion of 50 ppm/° C. or more.

Further, according to another aspect of the present invention, there is provided a method of manufacturing a liquid ejection head, the liquid ejection head including: a chip including an ejection orifice member including an ejection orifice for ejecting liquid, a substrate including an energy generating element for generating energy for ejecting liquid from the ejection orifice, and an electrode terminal for receiving electric power; an electric wiring board including lead wiring electrically connected to the electrode terminal; a support member for supporting the electric wiring board, the support member having an opening which surrounds the chip; a chip periphery sealing member which fills a gap between the chip and the support member in the opening; and an electrically connecting portion sealing member which is disposed in contact with the chip periphery sealing member and which covers an electrically connecting portion between the chip and the electric wiring board, the chip periphery sealing member and the electrically connecting portion sealing member having a difference in coefficient of linear expansion of 50 ppm/° C. or more, the method including: filling the gap between the chip and the support member in the opening with a material for forming the chip periphery sealing member, the material containing at least one kind of a polyether-modified polydimethylsiloxane, a polyester-modified polydimethylsiloxane, and an aralkyl-modified polymethylalkylsiloxane; covering the electrically connecting portion with a material for forming the electrically connecting portion sealing member containing filler, under a state in which the material for forming the electrically connecting portion sealing member is brought into contact with the material for forming the chip periphery sealing member; and curing the material for forming the chip periphery sealing member and the material for forming the electrically connecting portion sealing member, thereby forming the chip periphery sealing member and the electrically connecting portion sealing member.

Further features of the present invention will become apparent from the following description of exemplary embodiments with reference to the attached drawings.

DESCRIPTION OF THE EMBODIMENTS

Figure 1:
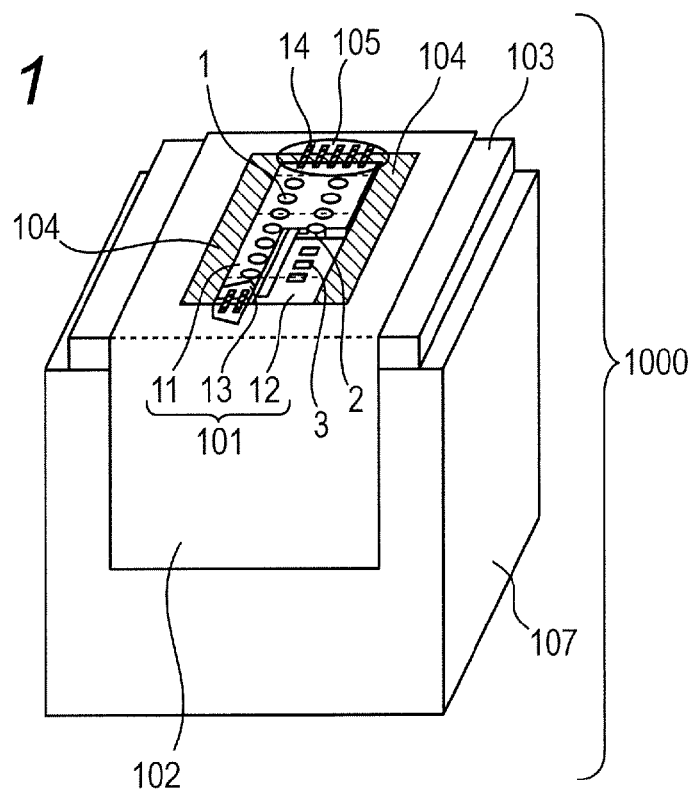
FIG. 1 is a schematic perspective view illustrating an exemplary liquid ejection head according to the present invention.

In general, desired characteristics of a sealing material used for an electrically connecting portion sealing member and desired characteristics of a sealing material used for a chip periphery sealing member are different. An electrically connecting portion sealing material (material for forming an electrically connecting portion sealing member) is desired to seal an electrically connecting portion and is also desired to be resistant to rubbing of the electrically connecting portion with a blade or the like in wiping around an ejection orifice of a recording head. The electrically connecting portion sealing material is required to be held in a predetermined region in application, that is, before curing. Thus, it is preferred that the electrically connecting portion sealing material be a material of high viscosity and of high thixotropy, and be a material of high hardness after curing. Therefore, the electrically connecting portion sealing material generally contains filler, and the coefficient of linear expansion (CTE) of the obtained electrically connecting portion sealing member becomes relatively small. On the other hand, a chip periphery sealing material (material for forming a chip periphery sealing member) is required to thoroughly flow through a gap between a support member for supporting a wiring board and a chip in a short time and to protect the chip against ink, dust, and the like. Therefore, it is preferred that the chip periphery sealing material be a material of low viscosity and of low thixotropy, and a material having satisfactory flowability. Therefore, the chip periphery sealing material generally does not contain filler, and the CTE of the obtained chip periphery sealing member becomes relatively large.

As described above, desired characteristics of the sealing materials are different from each other, and thus, when the electrically connecting portion sealing member is disposed in contact with the chip periphery sealing member, sometimes a phenomenon occurs that the electrically connecting portion sealing material runs off into the chip periphery sealing material. The runoff portion of the electrically connecting portion sealing member into the chip periphery sealing member, which is formed by the phenomenon, is formed under a state in which the two kinds of sealing members having different CTEs are in contact with each other. Thus, sometimes a crack develops due to stress caused by the difference in CTE.

Accordingly, an object of the present invention is to provide a highly reliable liquid ejection head which suppresses development of cracks and which has satisfactory heat cycle resistance even if a chip periphery sealing member and an electrically connecting portion sealing member are disposed in contact with each other, and to provide a method of manufacturing the liquid ejection head.

<Liquid Ejection Head>

The liquid ejection head according to the present invention can be used as an ink jet recording head for recording by ejecting ink onto a recording medium, and as a liquid ejection head for manufacturing a biochip or for printing an electronic circuit.

The liquid ejection head according to the present invention is described in detail below with reference to the attached drawings.

Figure 2:
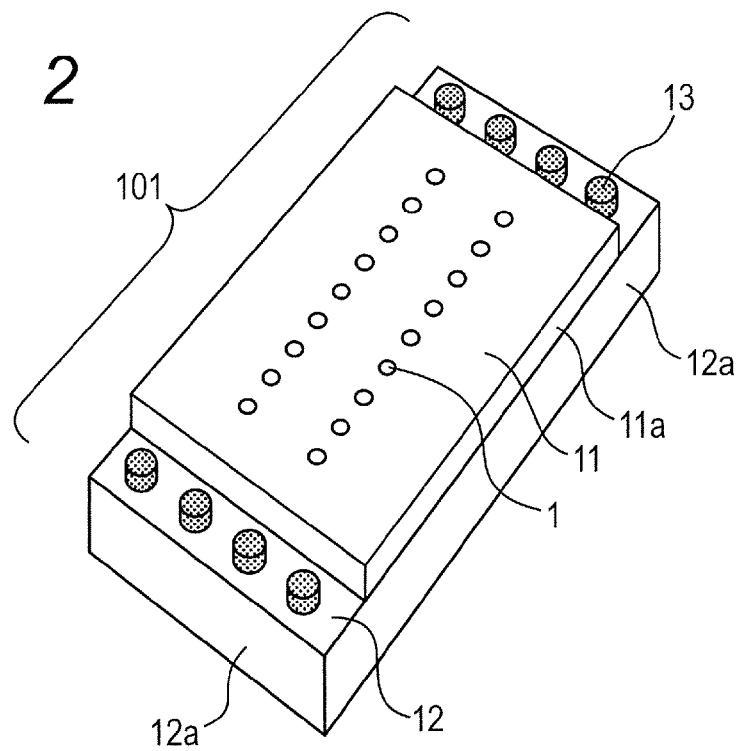
FIG. 2 is a schematic perspective view of an ejecting element substrate (chip) which can be used in the present invention.
Figure 3A:
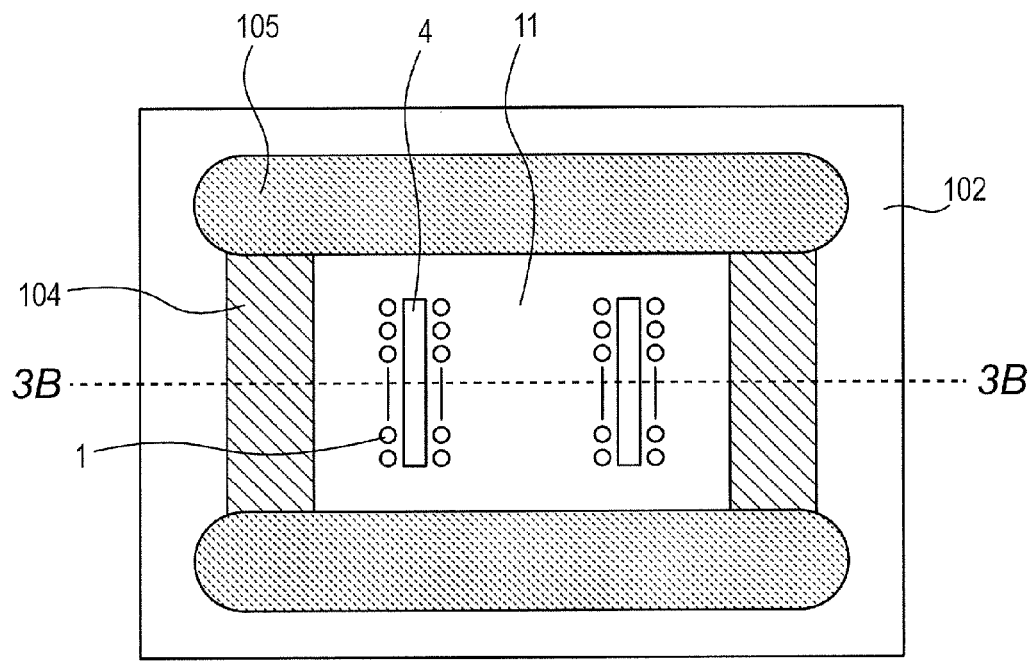
FIG. 3A is a schematic plan view illustrating an exemplary liquid ejection head according to the present invention.
Figure 3B:
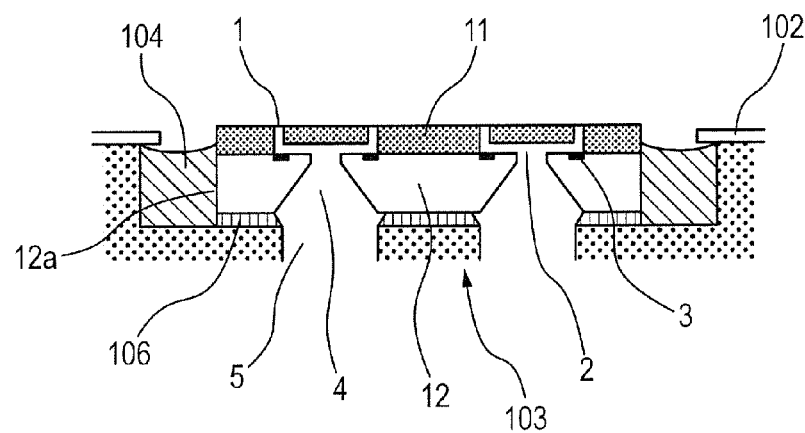
FIG. 3B is a schematic sectional view taken along the line 3B-3B of FIG. 3A.
Figure 4A:
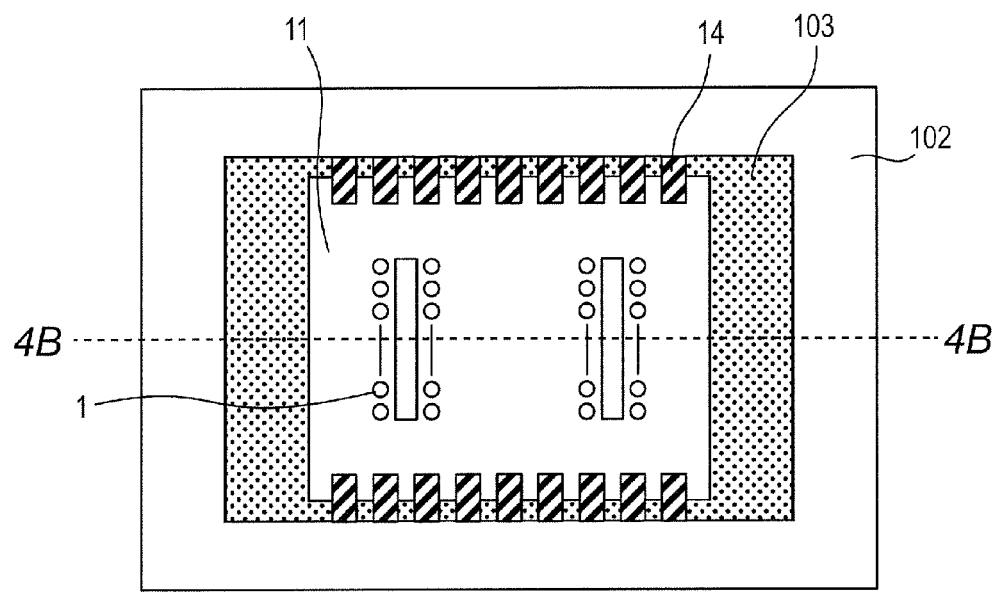
FIG. 4A is a schematic plan view illustrating a method of manufacturing a liquid ejection head according to the present invention.

FIG. 1 is a schematic perspective view illustrating an exemplary liquid ejection head according to the present invention. FIG. 2 is a schematic perspective view of an exemplary ejecting element substrate (chip) which can be used in the present invention. FIGS. 3A and 3B focus on part of an exemplary liquid ejection head according to the present invention. Note that, FIG. 3A is a schematic plan view of part of the exemplary liquid ejection head as seen from above an ejection orifice surface (one surface of an ejection orifice member which has ejection orifices), and FIG. 3B is a sectional view taken along the line 3B-3B of FIG. 3A. In FIG. 3A and FIG. 4A to be referred to later, the head is illustrated partly omitted in the long side direction thereof, and, in order to clarify the positional relationship between liquid supply ports 4 and ejection orifices 1 to be described later, the liquid supply ports 4 are illustrated.

As illustrated in FIG. 1, a liquid ejection head 1000 includes at least a chip 101, an electric wiring board 102, a support member 103, a chip periphery sealing member 104, and an electrically connecting portion sealing member 105. The liquid ejection head 1000 may further include an adhering member (106 in FIG. 3B) for supporting and fixing the chip 101 to the support member 103, and a member 107 for supporting the support member 103.

(Chip)

As illustrated in FIGS. 1 and 2, the chip 101 includes an ejection orifice member 11 having the ejection orifices 1 for ejecting liquid (for example, ink), a substrate 12 having energy generating elements 3 for generating energy used for ejecting liquid from the ejection orifices 1, and pads (electrode terminals) 13 for receiving electric power.

The ejection orifice member 11 may include a flow path 2 communicating to the ejection orifices 1, thereby functioning also as a flow path wall member that forms the wall of the flow path 2. The ejection orifice member 11 can be formed of a cured epoxy resin, a metal, silicon nitride, or the like.

Further, the ejection orifices 1 may be provided in accordance with the kind, the places, and the number (one or multiple) of the energy generating elements 3, and, as illustrated in FIG. 3B, the ejection orifices 1 may be provided over the multiple energy generating elements 3, respectively.

As the substrate 12 used in the chip 101, for example, a Si wafer having a crystal axis of (100) can be used. The shape of the substrate 12 is generally a rectangular parallelepiped, but the shape of the substrate 12 may be a circle or an oval as seen from the surface without sharp edges around the outer periphery, that is, a circular cylinder or an elliptic cylinder. Further, as illustrated in FIGS. 3A and 3B, the substrate 12 may include an ejection orifice member 11, specifically, liquid supply ports 4 for supplying liquid via the flow paths 2 to the energy generating elements 3. The ejection orifices 1 may be provided in lines on both sides of the supply ports 4 provided in the substrate 12. One or multiple supply ports 4 can be provided for one substrate 12, and, for example, can be formed by anisotropic etching using the crystal orientation of the substrate 12.

Note that, as the energy generating elements 3, elements publicly known in the field of liquid ejection head can be used, and, for example, heaters or piezoelectric elements can be used.

The pads 13 are provided at ends of the front surface of the substrate 12 (one surface of two opposed surfaces of the substrate 12 on which the ejection orifice member 11 is provided), and electric power can be supplied to the chip 101 via the pads 13 from the outside.

(Electric Wiring Board)

The electric wiring board 102 includes lead wiring 14, and is electrically connected to the chip 101 by electrically connecting the lead wiring 14 to the pads 13. Further, the electric wiring board 102 can include a through hole for incorporating the chip 101 thereinto, lead terminals (not shown) corresponding to the electrode terminals 13 of the chip 101, and input terminals (not shown) for receiving an electric signal from, for example, a printer main body. Note that, at least part of the chip 101 can be disposed in the through hole. In FIG. 3B, the electric wiring board 102 is disposed so as to surround the chip 101, specifically, the ejection orifice member 11.

(Support Member)

As illustrated in FIGS. 3A and 3B, the support member 103 supports (fixes by adhering) the electric wiring board 102 and includes an opening which surrounds the chip 101. Specifically, at least part of the chip 101 can be disposed in the opening in the support member 103. Note that, the opening in the support member 103 may have a bottom, that is, may be a recess. Further, by adhesive fixing the rear surface of the electric wiring board 102 to the support member 103, the chip 101 and the electric wiring board 102 may be electrically connected to each other so as to be substantially flush with each other. Note that, the support member 103 may include liquid supply flow paths 5 for supplying liquid to the liquid supply ports 4. The supply flow paths 5 are not included in the opening in the support member 103 surrounding the chip 101, and a sealing member is not disposed therein. Further, the support member 103 may be formed using a resin engineering plastic, alumina, ceramic, a metal, or the like, and the shape of the support member 103 may be, for example, plate-shaped.

Further, the opening (recess) in the support member 103 may be formed of two members (first support member and second support member). For example, by fixing a plate-shaped first support member having a through hole therein to the front surface (one surface on the side on which the chip 101 is fixed) of a plate-shaped second support member, a recess formed of the two members can be formed. Note that, those two members may be formed of different materials, or may be formed of the same material.

Further, the member 107 for supporting the support member 103 and the support member 103 may be integral with each other, and the member 107 may be, for example, an ink tank.

(Chip Periphery Sealing Member)

The chip periphery sealing member 104 can be disposed in a state of being in contact with at least part of the support member 103, and, in FIG. 3B, is disposed in a state of being in contact with the bottom surface and side surfaces of the opening (recess) in the support member 103. Further, the sealing member 104 can be provided on the outer periphery of the substrate 12, and may be disposed in a state of being in contact with at least part of side surfaces (end faces) 12a on the outer periphery of the substrate 12, or may be disposed in a state of being in contact with the entire outer peripheral surfaces of the substrate 12. Further, the chip periphery sealing member 104 may be disposed in a state of being in contact with the ejection orifice member 11 (in particular, outer side surfaces 11a of the ejection orifice member 11 illustrated in FIG. 2), part of the electric wiring board 102, the adhering member 106 (in particular, outer side surfaces of the adhering member 106), or the lead wiring 14.

In FIGS. 3A and 3B, the chip periphery sealing member 104 is provided around the chip 101, and fills a gap (15 in FIG. 4B) between the chip 101 and the support member 103 in the opening. Specifically, the sealing member 104 is provided so as to be in contact with both the side surfaces of the chip 101 (for example, the side surfaces 12a of the substrate 12) and the support member 103. This can prevent liquid or the like from being brought into contact with the side surfaces of the chip 101 (in particular, the substrate 12).

Further, the chip periphery sealing member 104 may be formed as the cured product of a chip periphery sealing material described below.

(Material for Forming Chip Periphery Sealing Member)

The chip periphery sealing material is required to fill the gap 15 between the support member 103 for supporting the chip 101 in the opening and the wiring board 102 and the chip 101 in a short time, and to protect the chip 101 (in particular, the substrate 12) against liquid such as ink and other substances. Note that, the gap 15 is generally 1 mm or less in width, and thus, the chip periphery sealing material is required to have flowability.

In order to achieve this function, it is desired to use, as the chip periphery sealing material, a material of low viscosity and having satisfactory flowability, and having low thixotropy so as to be flexible in a wide environmental temperature range.

While the chip periphery sealing material may simultaneously contain a base material, curing agent, and various additives to be described later, in the present invention, the chip periphery sealing material contains the following surface control agent for the purpose of reducing the surface tension of the chip periphery sealing material to provide the effects of the present invention. That is, at least one kind of a polyether-modified polydimethylsiloxane, a polyester-modified polydimethylsiloxane, and an aralkyl-modified polymethylalkylsiloxane is used in the chip periphery sealing material. Further, two or more kinds thereof may be used in combination.

Each of those siloxanes is a compound containing, as a main skeleton, a polysiloxane skeleton having two or more siloxane bonds, and is a compound having an organic group introduced at a part of the polysiloxane skeleton.

Note that, the introduction position (such as a side chain or a terminal) and introduction number (one or more) of the organic group (a polyether group, a polyester group, or an aralkyl group) introduced into each of those siloxanes may be appropriately selected within such a range that the effects of the present invention are obtained. Note that, the aralkyl group in the aralkyl-modified polymethylalkylsiloxane is, for example, an aralkyl group having 7 to 15 carbon atoms, and specific examples thereof include a benzyl group, a phenylethyl group, a phenylpropyl group, and a naphthylethyl group. In the chemical formula 4 to be described later, a phenylisopropyl group having 9 carbon atoms is shown as the aralkyl group. Further, each of those siloxanes may or may not contain a hydroxy group in the molecular structure.

From the viewpoint of obtaining an effect of reducing surface tension, the total blending amount of the siloxanes in the chip periphery sealing material is set to preferably 0.01 mass % or more, more preferably 0.1 mass % or more in the total amount of the chip periphery sealing material. Further, from the viewpoint of preventing a siloxane-derived outgas to be generated in a curing process from contaminating a chip surface, the total blending amount of the siloxanes is set to preferably 15 mass % or less, more preferably 10 mass % or less in the total amount of the chip periphery sealing material.

Blending any such compound having an ability to reduce surface tension into the chip periphery sealing material can suppress the formation of a runoff portion by the electrically connecting portion sealing member into the chip periphery sealing member. Note that, whether or not the runoff portion is formed may be confirmed with an optical microscope or the like. In addition, those siloxanes may be used in combination with any other compound having an ability to reduce surface tension (such as a modified silicone oil).

In the following chemical formulae 1 to 4, examples of the structures of those siloxanes are given. Specifically, in the chemical formulae 1 and 2, examples of the structure of the polyether-modified polydimethylsiloxane are given. Further, in the chemical formulae 3 and 4, examples of the structures of the polyester-modified polydimethylsiloxane and the aralkyl-modified polymethylalkylsiloxane are given, respectively.

Note that, the term "polydimethylsiloxane" in the siloxanes means a compound containing, as a main skeleton, a polysiloxane skeleton having one or more dimethylsiloxane bonds in the molecular structure.

(Chemical Formula 1) Polyether-Modified Polydimethylsiloxane-1

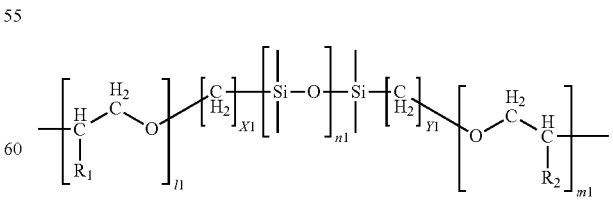

Note that, in the chemical formula 1, $R_1$ and $R_2$ each independently represent a hydrogen atom or an alkyl group having 1 or more and 5 or less carbon atoms, X1 and Y1 each independently represent an integer of 0 or more and 1,000 or less, and l1, n1, and m1 each independently represent an integer of 2 or more and 1,500 or less.

(Chemical Formula 2) Polyether-Modified Polydimethylsiloxane-2 (Polyether-Modified Siloxane)

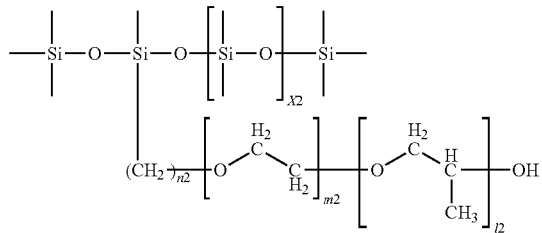

Note that, in the chemical formula 2, X2 represents an integer of 1 or more and 1,500 or less. Further, l2, n2, and m2 each independently represent an integer of 0 or more and 1,000 or less, provided that the sum of l2 and m2 is an integer of 2 or more.

(Chemical Formula 3) Polyester-Modified Polydimethylsiloxane

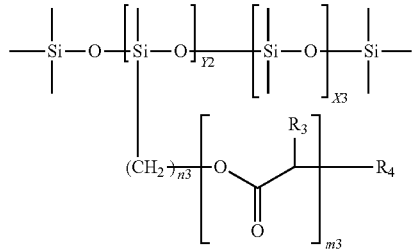

Note that, in the chemical formula 3, $R_3$ and $R_4$ each independently represent a hydrogen atom or an alkyl group having 1 or more and 5 or less carbon atoms, X3 and Y2 each independently represent an integer of 1 or more and 1,000 or less, n3 represents an integer of 0 or more and 1,000 or less, and m3 represents an integer of 2 or more and 1,500 or less.

(Chemical Formula 4) Aralkyl-Modified Polymethylalkylsiloxane

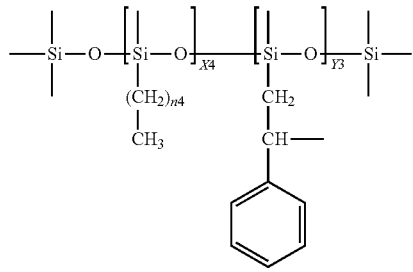

Note that, in the chemical formula 4, X4 and Y3 each independently represent an integer of 1 or more and 1,500 or less, and n4 represents an integer of 0 or more and 20 or less.

Marketed products of those siloxanes may be exemplified by the following products.

Polyether-modified polydimethylsiloxanes: BYK-333, BYK-306, BYK-331, and BYK-349 (all of which are trade names, manufactured by BYK Japan KK).

Polyether-modified hydroxy group-containing polydimethylsiloxane: BYK-377 (trade name, manufactured by BYK Japan KK).

Aralkyl-modified polymethylalkylsiloxane: BYK-322 and BYK-323 (both of which are trade names, manufactured by BYK Japan KK).

Polyester-modified hydroxy group-containing polydimethylsiloxane: BYK-370 (trade name, manufactured by BYK Japan KK).

Examples of the base material of the chip periphery sealing material may include a bisphenol-type epoxy resin, a bromine-containing epoxy resin, and phenol and cresol-type epoxy resins, a cyclic aliphatic epoxy resin, a glycidyl ester-based resin, a glycidylamine-based resin, and a heterocyclic epoxy resin, and silicone-modified, polybutadiene-modified, and urethane-modified products thereof and polyfunctionalized products thereof with pentaerythritol, trimethylolpropane, glycerin, and the like. Further, an acrylic resin, a styrene resin, modified products thereof, and the like may be used. Of those, a resin having an epoxy group in the molecular structure is preferred because of having excellent chemical resistance.

Further, it is preferred to use, as the base material, a satisfactorily flowable compound having a low viscosity, which easily flows through a narrow gap between a chip and the support member to allow a stress, which is generated owing to a difference in linear expansion coefficient between the sealant and the chip due to a difference in storage temperature of the head, to be easily alleviated. Accordingly, an epoxy resin having a polybutadiene skeleton or a silicone skeleton, or both a silicone skeleton and a polybutadiene skeleton is more preferred, and of those, an epoxy resin having at least a polybutadiene skeleton is still more preferably used. This epoxy resin has, in its molecular structure, a polybutadiene skeleton containing two or more 1,3-butadiene-derived structures (1,3-butadiene units). The structure of this polybutadiene skeleton is not particularly limited except for containing the units, and may be formed by, for example, polymerizing 1,3-butadiene. Note that, the 1,3-butadiene units may be present in the epoxy resin as 1,2-bond-type units in which 1,3-butadiene molecules are 1,2-bonded, or as 1,4-bond-type units in which 1,3-butadiene molecules are 1,4-bonded.

Note that, the epoxy resin having at least a polybutadiene skeleton has only to have a polybutadiene skeleton, and the rest of its structure is not particularly limited. Marketed products of the epoxy resin having a polybutadiene skeleton may be exemplified by the following products.

JP200 (trade name, manufactured by Nippon Soda Co., Ltd.), R45EPT (trade name, manufactured by Nagase ChemteX Corporation), and PB1000 (trade name, manufactured by Daicel Corporation).

Further, of those epoxy resins, an epoxy resin having a large epoxy equivalent is particularly preferred. Specifically, the epoxy equivalent is preferably 200 or more. When the epoxy equivalent is 200 or more, the cured product (chip periphery sealing member) can be easily prevented from becoming extremely hard, and the cured product itself and the chip can be easily prevented from cracking under a low-temperature environment. Further, from the viewpoint of flowability, an epoxy resin having a low viscosity is desired, and hence the epoxy equivalent is preferably 3,000 or less, and an epoxy resin having an epoxy equivalent of 220 or more and 1,500 or less is more preferred. The epoxy equivalent is a value in conformity with JISK7232-1986.

It is preferred to use, as the curing agent, an amine-based curing agent, an acid anhydride-based curing agent, or the like described below.

The amine-based curing agent may be exemplified by the following aliphatic amine, alicyclic amine, and aromatic amine, and other polyaminoamides.

Specifically, examples of the aliphatic amine may include ethylenediamine (EDA), diethylenetriamine (DETA), triethylenetetramine (TETA), tetraethylenepentamine (TEPA), dipropylenediamine (DPDA), diethylaminopropylamine (DEAPA), and hexamethylenediamine (HMDA).

Examples of the cyclic aliphatic (alicyclic) amine may include menthenediamine (MDA), isophoronediamine (IPDA), bis(4-amino-3-methyldicyclohexyl)methane, diaminodicyclohexylmethane, bis(aminomethyl)cyclohexane, N-aminoethylpiperazine, and 3,9-bis(3-aminopropyl)-2,4,8,10-tetraoxaspiro[5.5]undecane.

Examples of the aromatic amine may include m-xylenediamine, m-phenylenediamine (MPDA), diaminodiphenylmethane (DDM), diaminodiphenyl sulfone (DDS), and diaminodiethyldiphenylmethane.

Examples of the acid anhydride-based curing agent may include the following aliphatic acid anhydride, alicyclic acid anhydride, aromatic acid anhydride, and halogen-based acid anhydride.

Specifically, examples of the aliphatic acid anhydride may include dodecenyl succinic anhydride (DDSA), polyadipic anhydride (PADA), polyazelaic polyanhydride (PAPA), polysebacic polyanhydride (PSPA), poly(ethyloctadecanedioic) anhydride (SB-20AH), and poly(phenylhexadecanedioic) anhydride (ST-2PAH).

Examples of the alicyclic acid anhydride may include methyltetrahydrophthalic anhydride (Me-THPA), methylhexahydrophthalic anhydride (Me-HHPA), methyl Himic anhydride (MHAC), hexahydrophthalic anhydride (HHPA), tetrahydrophthalic anhydride (THPA), a trialkyltetrahydrophthalic anhydride (TATHPA), and methylcyclohexene tricarboxylic acid (MCTC).

Examples of the aromatic acid anhydride may include phthalic anhydride (PA), trimellitic anhydride (TMA), pyromellitic anhydride (PMDA), benzophenone tetracarboxylic anhydride (BTDA), and ethylene glycol bistrimellitate (TMEG).

Examples of the halogen-based acid anhydride may include HET anhydride (HET) and tetrabromophthalic anhydride (TBPA).

Of those acid anhydrides, an acid anhydride having a polybutadiene skeleton is particularly preferred for the same reason as in the case of the base material. Marketed products of the acid anhydride having a polybutadiene skeleton may be exemplified by the following products.

BN-1015 (trade name, manufactured by Nippon Soda Co., Ltd.), R131MA8 (trade name, manufactured by manufactured by Sartomer), and R131MA5 (trade name, manufactured by Sartomer).

In addition to the foregoing, examples of the curing agent may include a resol-type phenolic resin using a hydroxy group in the epoxy resin as a cross-linking point, a urea resin, a melamine resin, and an isocyanate- or blocked isocyanate-based curing agent. Further, a curing agent other than the above-mentioned curing agents may be used as long as it is used as a curing agent for an epoxy resin.

In addition, there may be used an amine adduct type, an epoxy adduct type, or the like in which the curing agent is enveloped by the base material or the same kind of resin, or the base material is enveloped by the curing agent, and the enveloping material is melted by heat during curing, and the curing of the curing agent and the base material starts.

Further, in addition to the base material, curing agent, and surface control agent described above, the following additives may be appropriately added to the chip periphery sealing material: an amine, a reactive monomer, a curing catalyst, and the like for accelerating the curing; and a monofunctional epoxy, an alcohol, a phenol, a silane coupling agent, oxetane, vinyl ether, and the like for the purposes of improving adhesiveness, reducing viscosity, and adjusting reactivity.

Further, in the case of using the base material and the curing agent each having a butadiene skeleton, when a generally used age resister or the like is added to the chip periphery sealing material, it can very effectively function to suppress oxidative degradation, thereby additionally improving the long-term reliability of the head. Examples of the age resister include "NOCRAC TNP" and "NOCRAC NS-6" (both of which are trade names, manufactured by OUCHI SHINKO CHEMICAL INDUSTRIAL CO., LTD).

Note that, examples of the curing catalyst may include imidazoles such as 2-methylimidazole, 2-phenylimidazole, 1,2-dimethylimidazole, and 2-methyl-4-methylimidazole. Further, as a cationic polymerization catalyst, there may be used a boron trifluoride amine complex or a triphenylsulfonium salt. Other additives include triphenylsulfone and the like. Further, a thermal cationic polymerization initiator may be used. A photo-cationic polymerization initiator may be used as required. Examples of the photo-cationic polymerization initiator include an aromatic onium salt.

Thus, the chip periphery sealing material to be used in the present invention preferably contains the epoxy resin having a polybutadiene skeleton, the acid anhydride having a polybutadiene skeleton, and the curing catalyst in addition to the siloxanes. With this, the advantages in the case of using polybutadiene skeleton compounds for the base material and the curing agent can be obtained, and curing conditions can be easily adjusted with the curing catalyst. Note that, the blending amounts of the epoxy resin as the base material and the curing agent in the chip periphery sealing material are preferably such amounts that an epoxy equivalent and an acid anhydride equivalent or active hydrogen equivalent are equivalent to each other. With this, the occurrence of a curing failure or the bleeding of the curing agent can be more reliably suppressed. However, for example, when a curing accelerator is used in the chip periphery sealing material, a material having excellent ink resistance can be easily obtained by reducing the blending amount of the curing agent by about 10 percent from the blending amount in the case of the equivalent blending.

(Electrically Connecting Portion Sealing Member)

The electrically connecting portion sealing member 105 is disposed in contact with the chip periphery sealing member 104, and covers electrically connecting portions between the chip 101 and the electric wiring board 102. The electrically connecting portion sealing member 105 seals the electrically connecting portions. The electrically connecting portions can include the lead wiring 14 for electrically connecting the chip 101 and the electric wiring board 102, the connecting portions (pads 13) between the lead wiring 14 and the chip 101, and connecting portions (not shown) between the lead wiring 14 and the electric wiring board 102.

Further, the electrically connecting portion sealing member may be formed as the cured product of an electrically connecting portion sealing material described below.

(Material for Forming Electrically Connecting Portion Sealing Member)

The electrically connecting portion sealing member 105 is required to seal the electrically connecting portions with reliability, and is also required to be resistant to peeling by being rubbed with a blade, a wiper, or the like for cleaning the ejection orifice arrangement surface and by being brought into contact with paper caused by paper jam when the head is mounted in a printer or the like. Therefore, as the electrically connecting portion sealing material, it is preferred to use a material of high hardness after curing, and of high viscosity and having high thixotropy so that the shape thereof is less liable to be changed, and, from this viewpoint, the electrically connecting portion sealing material contains filler.

As the filler, one which is publicly known in the field of liquid ejection head can be used. For example, silica, carbon black, titanium oxide, kaoline, clay, calcium carbonate, or the like may be used. As the filler, one or multiple kinds of materials may be used.

It is preferred that the content of the filler in the electrically connecting portion sealing material be 60 mass % or more and 80 mass % or less. Further, the electrically connecting portion sealing material can contain, in addition to the above-mentioned filler, a base material and a curing agent. As the base material and the curing agent, materials similar to those listed above as the base material and the curing agent of the chip periphery sealing material can be used.

Further, in addition to those, a curing accelerator, a reactive diluent, a silane coupling agent, and the like can be contained.

Note that, in the case where a compound having a butadiene skeleton is used as the base material and the curing agent, similarly to the case of the chip periphery sealing material, it is very effective to add, for example, the above-mentioned age resister or the like in terms of suppressing degradation by oxidation so as to further improve the long-term reliability of the head. Further, also in the electrically connecting portion sealing material, the blending amounts of the epoxy resin as the base material and the curing agent are preferably such amounts that an epoxy equivalent and an acid anhydride equivalent or active hydrogen equivalent are equivalent to each other. With this, the occurrence of a curing failure or the bleeding of the curing agent can be more reliably suppressed. For example, when a curing accelerator is used, a material having excellent ink resistance can be easily obtained by reducing the blending amount of the curing agent by about 10 percent from the above-mentioned blending amount.

Note that, from a viewpoint of suppressing pollution of a head face surface, it is preferred that the electrically connecting portion sealing material contain no component which may cause pollution of the head face surface such as an alkyl fluoride compound or a low-molecular cyclic siloxane.

(Other Members)

The adhering member 106 may be, for example, an adhesive such as a thermosetting epoxy resin. The substrate 12 and the support member 103 can be bonded together via the adhering member 106.

(Coefficient of Linear expansion)

The desired characteristics of the chip periphery sealing member 104 and the desired characteristics of the electrically connecting portion sealing member 105 are different, and thus, generally, the coefficient of linear expansion of the chip periphery sealing member 104 is larger than the coefficient of linear expansion of the electrically connecting portion sealing member 105. The coefficient of linear expansion of the chip periphery sealing member 104 may be, for example, 80 ppm/° C. or more and 200 ppm/° C. or less. However, from the viewpoint of reducing the influence of contraction stress and the like on the chip 101 as much as possible, the coefficient of linear expansion of the chip periphery sealing member 104 is preferably set to 85 ppm/° C. or more and 180 ppm/° C. or less, more preferably 90 ppm/° C. or more and 150 ppm/° C. or less. On the other hand, the coefficient of linear expansion of the electrically connecting portion sealing member 105 may be, for example, 8 ppm/° C. or more and 30 ppm/° C. or less.

For the above-mentioned reason, according to the present invention, the difference in coefficient of linear expansion between the chip periphery sealing member 104 and the electrically connecting portion sealing member 105 is 50 ppm/° C. or more. As described above, in a conventional liquid ejection head, when the difference in coefficient of linear expansion is large (50 ppm/° C. or more), sometimes a crack develops due to stress caused by the difference in CTE. However, in the liquid ejection head according to the present invention, even when the difference in coefficient of linear expansion is so large, development of cracks may be suppressed, and the liquid ejection head can have satisfactory heat cycle resistance.

<Method of Manufacturing Liquid Ejection Head>

Figure 4B:
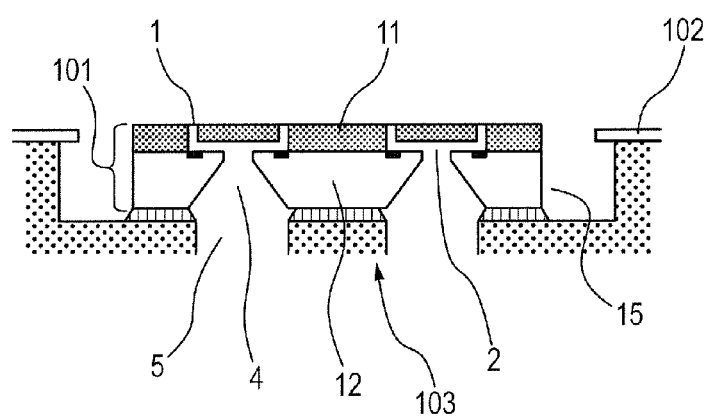
FIG. 4B is a schematic sectional view taken along the line 4B-4B of FIG. 4A.

Next, a manufacturing method according to the present invention is described in detail with reference to FIGS. 3A, 3B, 4A, and 4B. FIG. 4A is a top view of part (sealed portion) of a head before a chip periphery sealing material applying step (filling step) to be described later. FIG. 4B is a sectional view taken along the line 4B-4B of FIG. 4A.

First, as illustrated in FIGS. 4A and 4B, a head including the chip 101, the electric wiring board 102, and the support member 103 is prepared. In this head, the substrate 12 is fixed to the bottom surface of the opening in the support member 103 via the adhering member 106. Note that, the head can be manufactured using a method publicly known in the field of liquid ejection head, and can be manufactured through, for example, the following steps.

First, the energy generating elements 3 (for example, ejection pressure generating elements) and electrode terminals (pads 13) for supplying electric power to the elements are provided on a silicon substrate. After the terminals are protected, a resist pattern for forming the flow paths 2 and the ejection orifices 1 is formed. Then, a material for forming the ejection orifice member 11 (for example, an epoxy resin) is applied to the resist pattern and is cured. After that, the liquid supply ports are formed from the rear surface side of the silicon substrate, and the resist is removed from the supply ports to form the flow paths 2 and the ejection orifices 1. Then, the silicon substrate is cut to form multiple chips 101.

Next, the chip 101 is bonded to the bottom surface of the opening (recess) in the support member 103 of, for example, alumina, having the supply flow paths 5 therein, using an adhesive as the adhering member 106. Then, the electric wiring board 102 for supplying electric power from the outside of the head to the energy generating elements 3 and the like is electrically connected to the chip 101 using the lead wiring 14. At that time, plating or ball bumps can be formed on the pads 13. Further, the electric wiring board 102 is fixed to the support member 103. In this way, the head illustrated in FIGS. 4A and 4B can be obtained.

Next, a material (first composition) to be the chip periphery sealing member 104 for protecting the side surfaces of the chip 101 (for example, the side surfaces of the ejection orifice member 11 and the side surfaces of the substrate 12) against ink, dust, and the like is applied to a chip periphery sealing material applying portion which is the gap 15 between the chip 101 and the opening in the support member 103 (chip periphery sealing material applying step). In this case, the first composition is applied from, for example, above the lead wiring 14, and goes around to reach the rear surface of the lead wiring 14 and fills the gap 15. As described above, the first composition contains at least one kind of the polyether-modified polydimethylsiloxane, the polyester-modified polydimethylsiloxane, and the aralkyl-modified polymethylalkylsiloxane.

After that, by applying a material to be the electrically connecting portion sealing member 105 (second composition) containing filler from above the first composition to the electrically connecting portions between the chip 101 and the electric wiring board 102, the electrically connecting portions are sealed with the second composition (electrically connecting portion sealing material applying step (covering step)). At that time, the electrically connecting portion sealing material is applied on a region from the substrate 12 over the electrically connecting portions including the lead wiring 14, the applied chip periphery sealing material, and the electric wiring board 102. Therefore, the chip periphery sealing material and the electrically connecting portion sealing material are in a state of being in contact with each other. Further, in this case, the chip periphery sealing material and the electrically connecting portion sealing material are applied so that no gap is left therebetween. Note that, the electrically connecting portion sealing material may also be applied to the ejection orifice member 11 and the support member 103 when the electrically connecting portions are sealed.

Next, the chip periphery sealing material and the electrically connecting portion sealing material are, for example, simultaneously heated to be cured (curing step). This means that the curing reaction of those materials is accelerated by heat. Note that, when those materials are cured, the time taken until the curing reaction no longer progresses sometimes differs between those materials. In this case, heating can be continued even when the curing reaction of one of the materials ends so that both materials may attain satisfactory hardness. The conditions for the curing may be appropriately selected in accordance with the sealing material used, and, for example, may be at 120° C. for 1 hour.

In this way, the chip periphery sealing member 104 and the electrically connecting portion sealing member 105 which are disposed in contact with each other can be obtained, and the liquid ejection head illustrated in FIGS. 3A and 3B can be obtained.

EXAMPLES

The present invention is more specifically described by way of the following examples.

Examples 1 to 9 and Comparative Examples 1 to 5

The chip periphery sealing material and the electrically connecting portion sealing material were applied to the head illustrated in FIGS. 4A and 4B including the chip 101, the electric wiring board 102 electrically connected to the chip 101, and the support member 103 fixing the chip 101 and the wiring board 102. Then, those materials were simultaneously heated.

In each of the examples, as the chip periphery sealing material, compositions shown in Table 1 were used, and, as the electrically connecting portion sealing material, the following composition was used. The conditions for the heating were at 120° C. for 1 hour. Further, the following evaluation was made with regard to each of the examples. Note that, figures in the compositions of the chip periphery sealing material in Table 1 are in parts by mass.

(Electrically Connecting Portion Sealing Material Composition)

Base Material

EP-4100E (trade name): bis A-type epoxy resin manufactured by ADEKA CORPORATION, 100 parts by mass Curing Agent Hexahydrophthalic anhydride, 80 parts by mass Curing Catalyst 2E4MZ (trade name): imidazole-based curing catalyst manufactured by SHIKOKU CHEMICALS CORPORATION, 1 part by mass Filler FB-940 (trade name): silica filler manufactured by DENKA, 600 parts by mass Silane Coupling Agent A-187 (trade name): manufactured by Nippon Unicar Company Limited, 5 parts by mass (Evaluation of Flowability)

There is a correlation between the flowability and the viscosity, and thus, the viscosity at 25° C. of a liquid resin composition (chip periphery sealing material) before curing (at 2.5 rpm ($min^{-1}$)) was measured using a viscometer TVE-22H (trade name, manufactured by Toki Sangyo Co., Ltd), and evaluation was made in accordance with the following criteria.

○: The viscosity was less than 20 Pa·s and the flowability was satisfactory.

Δ: The viscosity was 20 Pa·s or more, which would present no problem when used, but would be susceptible to improvement.

(Difference in Coefficient of Linear expansion (CTE))

With regard to each of the examples, the difference in CTE between the electrically connecting portion sealing member 105 formed using the above-mentioned composition of the electrically connecting portion sealing material and the chip periphery sealing member 104 formed using the compositions of the chip periphery sealing material shown in Table 1 was evaluated in accordance with the following criteria. Note that, the coefficient of linear expansion of the electrically connecting portion sealing member 105 was 20 ppm/° C. The CTEs were measured using EXSTAR TMA/SS6100 (trade name, manufactured by SII NanoTechnology Inc.).

large: The difference in CTE was 50 ppm/° C. or more.

small: The difference in CTE was less than 50 ppm/° C.

(Heat Cycle Test)

With regard to each of the examples, the manufactured liquid ejection head was, after being left at −30° C. for 30 minutes, left at 100° C. for 30 minutes. This set was continuously repeated 100 times as a heat cycle test, and evaluation was made in accordance with the following criteria. As the heat cycle tester, TSE-11-A (trade name, manufactured by ESPEC Corp.) was used.

○: There was no specific change (No crack developed in the sealing members).

x: A crack developed in the sealing members.

TABLE 1

| | | Example | | | | | | | | | Comparative Example | | | | |
|---|---|---|---|---|---|---|---|---|---|---|---|---|---|---|---|
| | | 1 | 2 | 3 | 4 | 5 | 6 | 7 | 8 | 9 | 1 | 2 | 3 | 4 | 5 |
| Chip Periphery Sealing Material Composition | R45EPT[1] | 100 | | 100 | | 100 | 100 | 100 | 100 | 100 | 100 | 100 | | | |
| | EP4100E[2] | | 100 | | 100 | | | | | | | | 100 | 100 | 100 |
| | BN-1015[3] | 40 | | 40 | | 40 | 40 | 40 | 40 | 40 | 40 | 40 | | | |
| | Triethylenetetramine | | 20 | | 20 | | | | | | | | 20 | 20 | 20 |
| | PN-23[4] | 8 | | 8 | | 8 | 8 | 8 | 8 | 8 | 8 | 8 | | | |
| | FB-940[5] | | | | | | | | | | | | | 120 | 120 |
| | BYK-333[6] | 5 | 5 | | | | | | | | | | | | 5 |
| | BYK-306[7] | | | 5 | 1 | 0.5 | | | | | | | | | |
| | BYK-349[8] | | | | | | 0.1 | | | | | | | | |
| | BYK-322[9] | | | | | | 3 | 5 | | | | | | | |
| | BYK-323[10] | | | | | | | | 0.015 | | | | | | |
| | BYK-370[11] | | | | | | | | | 21.5 | | | | | |
| | BYK-381[12] | | | | | | | | | | 1 | | | | |
| Evaluation Item | Flowability | ○ | ○ | ○ | ○ | ○ | ○ | ○ | ○ | ○ | ○ | ○ | ○ | △ | △ |
| | Difference in CTE | Large | Large | Large | Large | Large | Large | Large | Large | Large | Large | Large | Large | Small | Small |
| | Heat Cycle Test | ○ | ○ | ○ | ○ | ○ | ○ | ○ | ○ | ○ | x | x | x | ○ | ○ |

Base material
[1] R45EPT (trade name): polybutadiene skeleton epoxy resin manufactured by Nagase ChemteX Corporation
[2] EP-4100E (trade name): bis A-type epoxy r7esin manufactured by ADEKA CORPORATION
Curing agent
[3] BN-1015 (trade name): polybutadiene skeleton acid anhydride manufactured by Nippon Soda Co., Ltd.
Curing catalyst
[4] PN-23 (trade name): imidazole-based amine adduct curing catalyst manufactured by Ajinomoto Fine-Techno Co., Inc.
Filler
[5] FB-940 (trade name): silica filler manufactured by DENKA
Surface control agent
[6] BYK-333 (trade name): polyether-modified polydimethylsiloxane manufactured by BYK Japan KK
[7] BYK-306 (trade name): polyether-modified polydimethylsiloxane manufactured by BYK Japan KK
[8] BYK-349 (trade name): polyether-modified polydimethylsiloxane (polyether-modified siloxane) manufactured by BYK Japan KK
[9] BYK-322 (trade name): aralkyl-modified polymethylalkylsiloxane manufactured by BYK Japan KK
[10] BYK-323 (trade name): aralkyl-modified polymethylalkylsiloxane manufactured by BYK Japan KK
[11] BYK-370 (trade name): polyester-modified hydroxy group- containing polydimethylsiloxane manufactured by BYK Japan KK
[12] BYK-381 (trade name): acrylic copolymer manufactured by BYK Japan KK In Comparative Example 1, the chip periphery sealing material contained one kind of surface control agent, i.e., the acrylic copolymer. However, a runoff portion was formed because the acrylic copolymer did not have a sufficient ability to reduce surface tension. Further, in Comparative Examples 2 and 3, the chip periphery sealing material did not contain a compound having an ability to reduce surface tension, i.e., any of the polyether-modified polydimethylsiloxane, the polyester-modified polydimethylsiloxane and the aralkyl-modified polymethylalkylsiloxane, and hence a runoff portion was formed. The presence or absence of the formation of a runoff portion was confirmed with an optical microscope for the boundary between the chip periphery sealing member 104 and the electrically connecting portion sealing member 105 after curing.

In those comparative examples, the difference in CTE with the electrically connecting portion sealing member 105 was 50 ppm/° C. or more and large, and a crack due to the difference in CTE developed in the sealing members in the heat cycle test.

Comparative Example 4 was the chip periphery sealing material of Comparative Example 3 to which the filler was added so as to be 50 mass % of the entire materials. In Comparative Example 4, the CTE was 35 ppm/° C., and the difference in CTE with the electrically connecting portion sealing member 105 was less than 50 ppm/° C. and small, and thus, a runoff portion was formed, but no problem was presented with regard to the heat cycle resistance. However, the flowability of the chip periphery sealing material was not satisfactory, and thus, additional time was taken to manufacture the liquid ejection head.

Comparative Example 5 was the chip periphery sealing material of Example 2 to which the filler was added so as to be 49 mass % of the entire materials. In Comparative Example 5, the surface tension of the chip periphery sealing member 104 was sufficiently lowered, and thus, no runoff portion was formed. Further, the difference in CTE with the electrically connecting portion sealing member 105 was less than 50 ppm/° C. and small, and thus, no problem was presented with regard to the heat cycle resistance. However, the flowability of the chip periphery sealing material was not satisfactory, and thus, additional time was taken to manufacture the liquid ejection head.

On the other hand, in Examples 1 to 9, by adding a predetermined compound having an ability to reduce the surface tension to the chip periphery sealing material, the surface tension of the chip periphery sealing material was sufficiently reduced, and thus, no runoff portion was formed. Therefore, although the difference in CTE between the chip periphery sealing member 104 and the electrically connecting portion sealing member 105 was 50 ppm/° C. or more, the heat cycle resistance was excellent. For example, the difference in CTE in Example 1 was 150 ppm/° C., and the difference in CTE in Example 2 was 80 ppm/° C. Further, in those examples, the flowability was also excellent, and a liquid ejection head could be manufactured efficiently.

According to the present invention, the highly reliable liquid ejection head which suppresses development of cracks and which has satisfactory heat cycle resistance even if the chip periphery sealing member and the electrically connecting portion sealing member are disposed in contact with each other, and the method of manufacturing the same can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-022995, filed on Feb. 6, 2012, which is hereby incorporated by reference herein in its entirety.

What is claimed is:

1. A liquid ejection head, comprising:
a chip comprising an ejection orifice member including an ejection orifice for ejecting liquid, a substrate including an energy generating element for generating energy for ejecting liquid from the ejection orifice, and an electrode terminal for receiving electric power;
an electric wiring board including lead wiring electrically connected to the electrode terminal;
a support member for supporting the electric wiring board, the support member having an opening which surrounds the chip;
a chip periphery sealing member which fills a gap between the chip and the support member in the opening; and
an electrically connecting portion sealing member which is disposed in contact with the chip periphery sealing member and which covers an electrically connecting portion between the chip and the electric wiring board,
wherein the electrically connecting portion sealing member comprises a cured product of a material for forming the electrically connecting portion sealing member containing filler,
the chip periphery sealing member comprises a cured product of a material for forming the chip periphery sealing member containing at least one kind of a polyether-modified polydimethylsiloxane, a polyester-modified polydimethylsiloxane, and an aralkyl-modified polymethylalkylsiloxane, and
the chip periphery sealing member and the electrically connecting portion sealing member have a difference in coefficient of linear expansion of 50 ppm/° C. or more.

2. The liquid ejection head according to claim 1, wherein the material for forming the chip periphery sealing member contains an epoxy resin having a polybutadiene skeleton.

3. A method of manufacturing a liquid ejection head,
the liquid ejection head comprising:
a chip comprising an ejection orifice member including an ejection orifice for ejecting liquid, a substrate including an energy generating element for generating energy for ejecting liquid from the ejection orifice, and an electrode terminal for receiving electric power;
an electric wiring board including lead wiring electrically connected to the electrode terminal;
a support member for supporting the electric wiring board, the support member having an opening which surrounds the chip;
a chip periphery sealing member which fills a gap between the chip and the support member in the opening; and
an electrically connecting portion sealing member which is disposed in contact with the chip periphery sealing member and which covers an electrically connecting portion between the chip and the electric wiring board,
the chip periphery sealing member and the electrically connecting portion sealing member having a difference in coefficient of linear expansion of 50 ppm/° C. or more,
the method comprising:
filling the gap between the chip and the support member in the opening with a material for forming the chip periphery sealing member, the material containing at least one kind of a polyether-modified polydimethylsiloxane, a polyester-modified polydimethylsiloxane, and an aralkyl-modified polymethylalkylsiloxane;
covering the electrically connecting portion with a material for forming the electrically connecting portion sealing member containing filler, under a state in which the material for forming the electrically connecting portion sealing member is brought into contact with the material for forming the chip periphery sealing member; and
curing the material for forming the chip periphery sealing member and the material for forming the electrically connecting portion sealing member, thereby forming the chip periphery sealing member and the electrically connecting portion sealing member.

4. The liquid ejection head according to claim 1, wherein a content of the filler in the electrically connecting portion sealing member is 60 mass % or more and 80 mass % or less in the electrically connecting portion sealing member.

5. The liquid ejection head according to claim 1, wherein the electrically connecting portion sealing member comprises a silane coupling agent.

6. The liquid ejection head according to claim 1, wherein the material for forming the chip periphery sealing member contains an acid anhydride having a polybutadiene skeleton.

7. The liquid ejection head according to claim 1, wherein the material for forming the chip periphery sealing member contains a curing catalyst.

8. The liquid ejection head according to claim 1, wherein a total content of the polyether-modified polydimethylsiloxane, the polyester-modified polydimethylsiloxane, and the aralkyl-modified polymethylalkylsiloxane of the material for forming the chip periphery sealing member is 0.01 mass % or more and 15 mass % or less in the material for forming the chip periphery sealing member.

9. The liquid ejection head according to claim 1, wherein the material for forming the chip periphery sealing member comprises at least one of an amine-based curing agent and an acid anhydride-based curing agent.

10. The liquid ejection head according to claim 1, wherein the chip periphery sealing member has a coefficient of linear expansion of 80 ppm/° C. or more and 200 ppm/° C. or less.

11. The liquid ejection head according to claim 1, wherein the electrically connecting portion sealing member has a coefficient of linear expansion of 8 ppm/° C. or more and 30 ppm/° C. or less.

* * * * *